(12) United States Patent
Vella-Coleiro et al.

(10) Patent No.: US 10,009,121 B2
(45) Date of Patent: Jun. 26, 2018

(54) TESTING METHODS USING SPREAD-SPECTRUM EXCITATION SIGNALS AND RELATED TEST APPARATUS

(71) Applicant: CommScope Technologies LLC, Hickory, NC (US)

(72) Inventors: George P. Vella-Coleiro, Summit, NJ (US); XiaoHua Hou, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days. days.

(21) Appl. No.: 15/491,069

(22) Filed: Apr. 19, 2017

(65) Prior Publication Data

US 2017/0317766 A1   Nov. 2, 2017

Related U.S. Application Data

(60) Provisional application No. 62/329,369, filed on Apr. 29, 2016.

(51) Int. Cl.
| | |
|---|---|
| *H04B 1/00* | (2006.01) |
| *H04B 17/00* | (2015.01) |
| *G01R 23/20* | (2006.01) |
| *H04B 1/707* | (2011.01) |

(52) U.S. Cl.
CPC ............ *H04B 17/00* (2013.01); *G01R 23/20* (2013.01); *H04B 17/0085* (2013.01); *H04B 1/707* (2013.01)

(58) Field of Classification Search
CPC ........ H04B 1/707; H04B 1/69; H04B 17/005; G01R 29/26; G01R 23/20; G01R 27/28; G01R 35/00

USPC ............ 375/130, 224, 228; 455/67.11, 115.2
See application file for complete search history.

(56) References Cited

U.S. PATENT DOCUMENTS

| | | | |
|---|---|---|---|
| 6,144,692 A | 11/2000 | Beck | |
| 6,687,500 B1* | 2/2004 | Causey | ................ H04W 24/00 455/423 |
| 2005/0215208 A1* | 9/2005 | Stoddard | ................ H04B 1/713 455/115.2 |
| 2006/0003704 A1 | 1/2006 | Jin | |
| 2008/0009254 A1 | 1/2008 | Jin | |

(Continued)

OTHER PUBLICATIONS

A. Gagnon et al., "Frequency Independent Suppression of Interference Signals on Spread-Spectrum Communications," Military Communications Conference, 991, MILCOM, 1991 Conference Record, Military Communications in a Changing World, IEEE, vol. 1, pp. 380-384.

(Continued)

*Primary Examiner* — Khai Tran
(74) *Attorney, Agent, or Firm* — Myers Bigel, P.A.

(57) ABSTRACT

According to methods of performing a passive inter-modulation distortion ("PID") test, a first excitation signal and a second excitation signal are applied to a device under test, where at least one of the first and second excitation signals is a spread spectrum excitation signal. An output signal is received that includes a PID signal generated from mixing of the first and second excitation signals. At least a portion of the output signal is de-spread. A characteristic of the PID signal may then be measured.

20 Claims, 3 Drawing Sheets

(56) References Cited

U.S. PATENT DOCUMENTS

2013/0182753 A1 7/2013 Delforce et al.
2017/0126337 A1 5/2017 Schwab et al.

OTHER PUBLICATIONS

3GPP, Technical Specification—"3rd Generation Partnership Project; Technical Specification Group Radio Access Network; Passive Intermodulation (PIM) Handling for Base Stations (BS), (Release 12)", 3GPP TR 37.808 V12.0.0 (Sep. 2013), 27 pp.

* cited by examiner

TESTING METHODS USING SPREAD-SPECTRUM EXCITATION SIGNALS AND RELATED TEST APPARATUS

CROSS-REFERENCE TO RELATED APPLICATION

The present application claims priority under 35 U.S.C. § 119 from U.S. Provisional Patent Application Ser. No. 62/329,369, filed Apr. 29, 2016, the entire content of which is incorporated herein in its entirety.

FIELD OF THE INVENTION

The present invention relates generally to communications systems and, more particularly, to methods and apparatus for testing components used in radio frequency ("RF") communications systems.

BACKGROUND

Passive inter-modulation distortion ("PID") is a form of electrical interference that may occur when two or more RF signals encounter non-linear electrical junctions or materials along an RF transmission path. Such non-linearities may act like a mixer causing the RF signals to generate new RF signals at mathematical combinations of the original RF signals. These newly generated RF signals are referred to as "inter-modulation products." The newly generated RF signals fall within the bandwidth of existing RF signals. This may occur, for example, when signals transmitted through a device generate inter-modulation products that fall in the same bandwidth of signals that are received through the same device. If this occurs, the noise level experienced by the existing RF signals in the receiver bandwidth is increased. When the noise level is increased, it may be necessary to reduce the data rate and/or the quality of service. PID can be an important interconnection quality characteristic, as PID generated by a single low quality interconnection may degrade the electrical performance of the entire RF communications system. Thus, ensuring that components used in RF communications systems will generate acceptably low levels of PID may be desirable.

The above-described inter-modulation products arise because non-linear systems generate harmonics in response to sinusoidal inputs. For example, when a signal having a first frequency $S_{f1}$ is input to a non-linear system, then the resulting output signal will include signals at integer multiples of the input frequency. When two or more signals having different frequencies are input to a non-linear system, inter-modulation products arise. For example, consider a composite input signal x(t) to a non-linear system that includes signals at three different frequencies:

$$x(t)=A_1 \sin(2\pi f_1 t+\varphi_1)+A_2 \sin(2\pi f_2 t+\varphi_2)+A_3 \sin(2\pi f_3 t+\varphi_3) \quad (1)$$

In Equation (1) above, $A_i$ and $\varphi_i$ are the amplitudes and phases of the signals at the three different frequencies $f_1$, $f_2$, $f_3$. These signals are passed through a non-linearity. The resulting output signal will include components at the frequencies $f_1$, $f_2$, $f_3$ of the three input signals, which are referred to as the fundamental components, as well as linear combinations of these fundamental components having the form:

$$k_1 f_1 + k_2 f_2 + k_3 f_3 \quad (2)$$

where $k_1$, $k_2$, $k_3$ are arbitrary integers which can have positive or negative values. These components are the inter-modulation products and harmonics, and will have amplitudes and phases that are a function of the non-linearity and the composite input signal x(t).

The order of an inter-modulation product is the sum of the absolute value of the coefficients $1c_i$ included in the inter-modulation product. In the above example where the composite input signal x(t) includes signals at three different frequencies, the third order inter-modulation products are the inter-modulation products where:

$$|k_1|+|k_2|+|k_3|=3, \text{ where } |k_1|,|k_2|,|k_3|<3 \quad (3)$$

In the above example, the third-order inter-modulation products will be at the following frequencies:

$f_1+f_2-f_3$ $f_1+f_3-f_2$ $f_2+f_3-f_1$ $2f_1-f_2$ $2f_1-f_3$ $2f_2-f_1$ $2f_2-f_3$ $2f_3-f_1$ $2f_3-f_2$

The odd-order inter-modulation products are typically of the most interest as these products are the ones that tend to fall in the vicinity of the frequencies of the fundamental components.

PID may be caused by, for example, inconsistent metal-to-metal contacts along an RF transmission path, particularly when such inconsistent contacts are in high current density regions of the transmission path such as inside RF transmission lines, inside RF components, or on current carrying surfaces of an antenna. Such inconsistent metal-to-metal contacts may occur, for example, because of contaminated and/or oxidized signal carrying surfaces, loose connections between two connectors, metal flakes or shavings inside RF components or connections and/or poorly prepared soldered connections (e.g., a poor solder termination of a coaxial cable onto a printed circuit board). PID may arise in a variety of different components of an RF communications system. For example, non-linearities may exist at the interconnections in an RF communications system where cables such as coaxial cables are connected to each other or to RF equipment. PID may also arise in other components of an RF communications system such as RF amplifiers, duplexers, cross-band couplers, interference mitigation filters and the like. PID may also arise on or within radiating elements of the RF communications system such as parabolic antennas or phased array antenna elements. The non-linearities that give rise to PID may be introduced at the time of manufacture, during installation, or due to electro-mechanical shift over time due to, for example, mechanical stress, vibration, thermal cycling, and/or material degradation.

PID testing is routinely performed to identify components and/or interconnections that exhibit unacceptably high levels of PID. International standard IEC 62037 sets out acceptable techniques for measuring PID. Typically, various components of an RF transmission system will be rated to have PID levels below certain ranges when tested according to the above-referenced international standard. PID measurements may specify, for example, a magnitude of a third order inter-modulation distortion signal.

SUMMARY

Pursuant to embodiments of the present invention, methods of performing a PID test are provided in which a first excitation signal and a second excitation signal are applied to a device under test, where at least one of the first and second excitation signals is a spread spectrum excitation signal. An output signal is received that includes a PID signal generated from mixing of the first and second excitation signals. At least a portion of the output signal is de-spread. Finally, a characteristic of the PID signal may be measured.

In some embodiments, the output signal may include a spread spectrum PID signal. In such embodiments, the portion of the output signal that is de-spread may comprise the spread spectrum PID signal.

In some embodiments, the first RF excitation signal may comprise a continuous wave radio frequency (RF) excitation signal and the spread spectrum excitation signal may comprise a continuous wave RF signal that has had a first pseudo-random code sequence applied thereto. In such embodiments, de-spreading at least the portion of the output signal output may comprise applying the first pseudo-random code sequence to the output signal. The method may further include the step of spreading an interfering signal that is included in the output signal.

In some embodiments, the output signal may be down-converted prior to de-spreading. The output signal may be down-converted, for example, to a digitized base band signal or to an intermediate frequency signal having a frequency that is less than a frequency of the first excitation signal.

In some embodiments, a chip rate of the pseudo-random code sequence may be selected to generate a spread spectrum PID signal having a bandwidth that lies within a receive frequency bandwidth of the device under test.

In some embodiments, the PID signal may comprise a third order inter-modulation product of the first excitation signal and the second spread spectrum excitation signal, where a center frequency of the PID signal is a frequency that is twice a center frequency of the first excitation signal minus a center frequency of the second spread spectrum excitation signal. In some embodiments, a frequency of the first excitation signal may be less than a center frequency of the second spread spectrum excitation signal, while in other a frequency of the first excitation signal may be greater than a center frequency of the second spread spectrum excitation signal.

Pursuant to embodiments of the present invention, methods of performing a PID test are provided in which a first excitation signal is generated and a first pseudo-random code sequence is applied to a second signal to generate a second spread spectrum excitation signal. The first excitation signal and the second spread spectrum excitation signal are applied to a device under test. An output signal that is output from the device under test is processed to generate a processed output signal. The first pseudo-random code sequence is applied to the processed output signal, and then a characteristic of a PID signal included in the processed output signal is measured.

In some embodiments, the PID signal included in the processed output signal may comprise a spread spectrum PID signal, and application of the first pseudo-random code sequence to the processed output signal may de-spread the spread spectrum PID signal. Applying the first pseudo-random code sequence to the processed output signal may further act to convert an interfering signal included in the processed output signal into a spread spectrum interfering signal.

In some embodiments, processing the output signal that is output from the device under test to generate a processed output signal may comprise filtering the output signal based on a bandwidth of a receive frequency band of the device under test.

In some embodiments, the filtered output signal may be down-converted to one of baseband or an intermediate frequency that is between baseband and a frequency of the first excitation signal.

In some embodiments, the first signal may be a continuous wave excitation signal and the second excitation signal may be a continuous wave signal.

Pursuant to still further embodiments of the present invention, a PID test apparatus is provided that includes at least one signal generator that is configured to generate a first excitation signal and a second spread spectrum excitation signal, a test apparatus that holds a device under test, the device under test configured to receive the first and second excitations signals from the at least one signal generator, a receiver that is coupled to an output of the device under test so as to receive and down-convert an output signal that includes a PID signal generated by mixing of the first excitation signal and the second spread spectrum excitation signal, a de-spreader that de-spreads the down-converted output signal, and a signal analyzer that measures a characteristic of the de-spread down-converted output signal.

DETAILED DESCRIPTION

Figure 1:
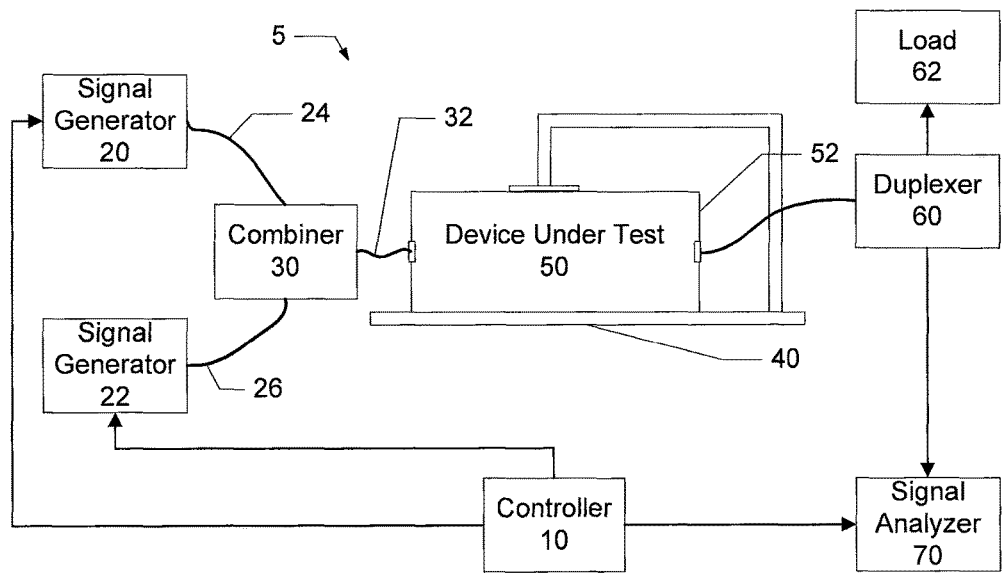
FIG. 1 is a block diagram of a conventional PID test apparatus.

Measuring and controlling the levels of PID may be important for providing high performance RF communications systems. Unfortunately, PID measurements are difficult to perform because the PID signals may be close to the noise floor. The difficulty in measuring PID signals increases significantly when interfering signals are present, which can be undesired signals that are generated by the test apparatus and/or RF energy that impinges on the test equipment from external sources. While it is possible to reduce or eliminate the presence of interfering signals from external sources by performing the PID testing in a shielded room, such rooms are costly to build and maintain and still may not fully eliminate the interfering signals.

Another method for addressing the presence of interfering signals in a PID test is to use filters such as notch filters or low pass and/or high pass filters to remove the interfering signals. However, when an interfering signal is close in frequency to a frequency where a PID signal of interest is generated, it may not be possible to remove the interfering signal using a filter. Moreover, during PID tests, the excitation signals (i.e., the signals used to generate the PID) are typically generated at a variety of different frequencies to measure PID across the entire bandwidth of the receiver. As such, for at least some of these tests, it may not be possible to filter out the interfering signal as it will be substantially coexistent in frequency with the PID signal.

Pursuant to embodiments of the present invention, methods of testing for PID are provided in which the negative effects of interfering signals can be significantly mitigated. As a result, the PID testing methods disclosed herein may more accurately measure the PID levels, even when interfering signals are present. The testing methods disclosed herein may more accurately identify devices that have unacceptable PID performance—before such devices are mounted, for example, on an antenna tower—and may also avoid the need and expense of RF shielded testing rooms for the PID tests.

Pursuant to the PID testing methods according to embodiments of the present invention, at least one of the excitation signals that is used to generate the PID is a spread-spectrum signal that may be generated, for example, by applying a pseudo-random code sequence to a continuous wave excitation signal. Application of the pseudo-random code sequence spreads the bandwidth of the excitation signal over a much larger bandwidth. The PID signals generated by the mixing of the spread spectrum excitation signal along with one or more other signals (e.g., one additional continuous wave signal) will also be spread spectrum signals. At the receiver, the received signal—which will include both the received spread spectrum PID signal and any interfering signal—may be down-converted into, for example, a digitized baseband signal. The same pseudo-random code sequence may be applied to this received digitized baseband signal, which acts to de-spread the portion of the received signal that comprises the spread spectrum PID signal. However, as any interfering signal that is present in the received signal is not a spread spectrum signal, application of the pseudo-random code sequence to the interfering signal at the receiver acts to spread the interfering signal out in bandwidth, with a corresponding reduction in the signal level of the interfering signal within the bandwidth of the receiver. Thus, the above technique may significantly reduce the amplitude level of the interfering signal in the receiver bandwidth (i.e., in the area of interest for the PID test) such that the interfering signal may blend into the noise floor and have a reduced impact on the PID test.

Before describing PID testing methods and apparatus according to embodiments of the present invention, it is helpful to briefly discuss a conventional PID test apparatus and PID test method.

In particular, turning to FIG. 1, a simplified block diagram of a conventional PID test apparatus 5 is illustrated. As shown in FIG. 1, the test apparatus 5 includes a controller 10, a pair of signal generators 20, 22, a combiner 30, a test station 40 that may have a device under test 50 mounted therein, a duplexer 60, a load 62 and a signal analyzer 70. It will be appreciated that the PID test apparatus 5 may include other elements that are not depicted in FIG. 1.

In order to conduct a PID test on the device under test 50, each signal generator 20, 22 may generate an RF signal that is fed to a combiner 30 through respective coaxial cables 24, 26. The combiner 30 combines these RF signals and an output of the combiner 30 is connected to an input port of the device under test 50 by a coaxial cable 32. The two RF signals that are supplied to the device under test 50 are referred to herein as "excitation" signals, as they are the signals that are used to generate the PID signals (i.e., the above-described inter-modulation products). The excitation signals are typically continuous wave RF signals (i.e., an RF signal at a discrete frequency that has almost 0 bandwidth). If the device under test 50 has non-linearities such as for example, inconsistent metal-to-metal contacts or other non-linear electrical junctions, the two excitation signals will mix, resulting in the generation of inter-modulation products in the manner discussed above.

Still referring to FIG. 1, an output 52 of the device under test 50 is fed to a duplexer 60 that separates the transmit and receive frequency bands for the communications system at issue. The signal energy in the transmit frequency band is delivered to the load 62, while the signal energy in the receive frequency band is delivered to a signal analyzer 70 such as a spectrum analyzer. The signal analyzer 70 measures the signal energy in the received frequency band, which will be a combination of the noise floor, any interfering signals, and any inter-modulation products, where the inter-modulation products are referred to herein as the "PID signal." Typically, the controller 10 may generate a series of pairs of excitation signals and measure the resulting signal energy in the receive frequency band in order to measure the PID levels under various different operating conditions.

Example embodiments of the present invention will now be discussed in further detail with reference to the drawings.

Figure 2:
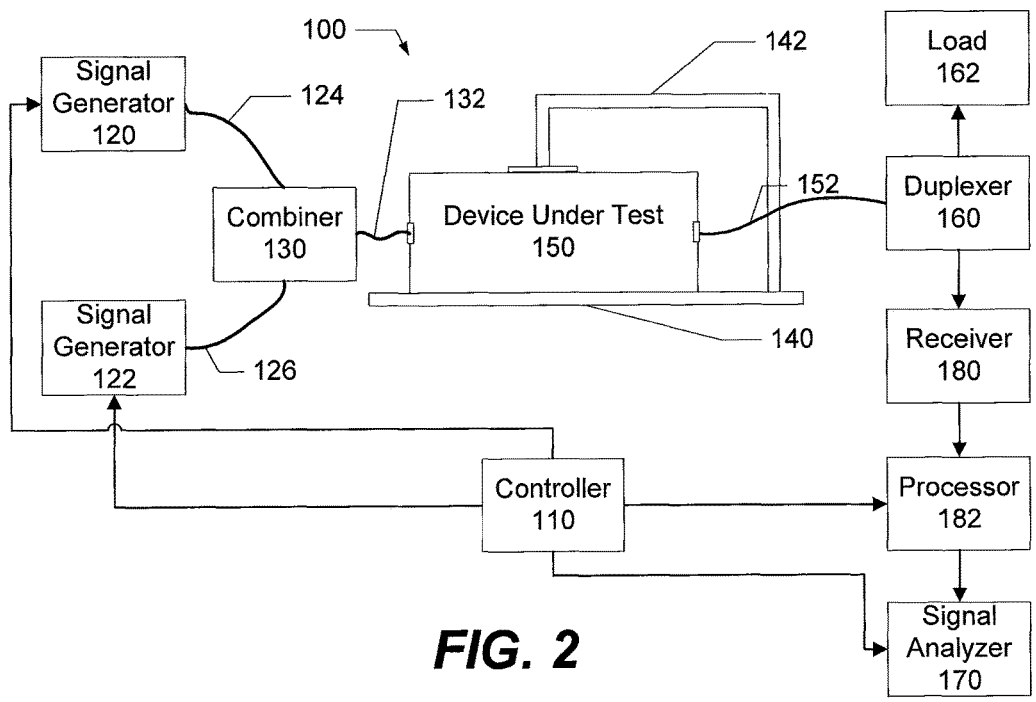
FIG. 2 is a block diagram of a PID test apparatus according to embodiments of the present invention.

FIG. 2 is a block diagram of a PID test apparatus 100 according to embodiments of the present invention.

As shown in FIG. 2, the PID test apparatus 100 includes a controller 110, a first signal generator 120, a second signal generator 122, a combiner 130, a test station 140, a device under test 150 that may be mounted in the test station 140, a duplexer 160, a load 162, a receiver 180, a processor 182 and a signal analyzer 170. It will be appreciated that only certain elements of the PID test apparatus 100 are shown in FIG. 2 in order to highlight features of the PID testing methods according to embodiments of the present invention. Thus, it will be understood that other elements may further be included such as all elements necessary to perform a PID test in compliance with the above-referenced International standard IEC 62037.

The controller 110 may be any suitable processing/control device that may run a test program and control various of the components of the PID test apparatus 100 including, for example, the signal generators 120, 122, the test station 140, the receiver 180, the processor 182 and/or the signal analyzer 170. The controller 110 may be, for example, a personal computer. The signal generators 120, 122 may be, for example, signal generation test equipment or actual radios such as, for example, base station radios or remote radio heads. At least one of the signal generators 120, 122 may be capable of generating a spread spectrum excitation signal. A single signal generator may be used in some embodiments that generates multiple excitation signals. The test apparatus 140 may simply be a fixture that holds the device under test 150. The test apparatus 140 may include one or more restraining members 142 that may hold the device under test 150 firmly in place. This may facilitate dynamic PID testing where the device under test 150 is subjected to hammer strikes or other forces during the PID testing. The device under test 150 may be any device which is to be subject to PID testing. Example types of devices include RF amplifiers, duplexers, diplexers, cross-band couplers, interference mitigation filters and the like. The device under test 150 may be a discrete device or a series of connected devices. The duplexer 160 may comprise a standard duplexer that separates the transmit and receive frequency bands for the communications system at issue. The duplexer 160 may be a device that has already been qualified as a low PID device so that the duplexer 160 creates little or no PID. The load 162 may be any load device that absorbs the signal energy in the transmit frequency band.

The receiver 180 may be any appropriate receiver, such as a test apparatus receiver or other receiver, such as the receive portion of a radio such as a remote radio head. The receiver 180 may be a high-sensitivity receiver. The receiver 180 may be configured to down-convert the received signal energy to, for example, a digital baseband signal or to an intermediate frequency signal. The processor 182 may be any processing device that can perform a Fourier transform on the output stream from the receiver 180. The signal analyzer 170 may comprise, for example, a device that displays the results of the Fourier transform and determines the power of the PID at the appropriate frequencies.

As discussed above, pursuant to embodiments of the present invention, PID tests may be conducted where a pseudo-random code sequence is applied to at least one of the excitation signals to convert the excitation signal into a pseudo-noise spread spectrum excitation signal. As a result, any PID signals generated in the device under test 150 will be spread spectrum PID signals. The portion of the signal output from the device under test 150 that is in the receive frequency band may be passed to the receiver 180, where it is down-converted to baseband or an intermediate frequency. A pseudo-random code sequence may be applied to the down-converted signal that is output from the receiver 180 in order to de-spread the PID signal. Moreover, since the pseudo-random code sequence was not applied to any interfering signal (e.g., external noise, noise generated within the test apparatus, etc.) that was input to the device under test 150, the application of the pseudo-random code sequence to the received signal acts to convert the interfering signal(s) into spread spectrum signal(s). In this fashion, much of the signal energy of the interfering signal(s) (if any) may be spread out in bandwidth, thereby significantly reducing the magnitude of the portions of the interfering signals that are co-located with a PID signal.

A PID test according to embodiments of the present invention may be performed as follows. The controller 110 may control the first signal generator 120 to generate a first continuous wave RF signal at a first pre-selected frequency. The first pre-selected frequency may be, for example, a frequency within the transmit bandwidth of the communications system in which the device under test 150 will be used. The first continuous wave RF signal will act as a first excitation signal for the PID test.

The controller 110 may likewise control the second signal generator 122 to generate a second continuous wave RF signal at a second pre-selected frequency. The second pre-selected frequency may also be, for example, a frequency within the transmit bandwidth of the communication system in which the device under test 150 will be used. The controller 110 may also control the second signal generator 122 (or alternatively, another device, not shown) to apply a pseudo-random code sequence to the second continuous wave RF signal to convert the second continuous wave RF signal into a spread spectrum signal. This spread spectrum signal will act as a second excitation signal for the PID test and will be referred to herein as a "second excitation signal" or as a "second spread spectrum excitation signal." While first and second signal generators 120, 122 are illustrated in FIG. 2, it will be appreciated that a single signal generator (e.g., signal generator 120) may be used to generate both the first excitation signal and the second spread spectrum excitation signal.

As shown in FIG. 2, the first excitation signal and the second spread spectrum excitation signal may be fed into the combiner 130 through respective first and second coaxial cables 124, 126. The combiner 130 combines these two signals and feeds the combined signal into the device under test 150 through a coaxial cable 132. If the device under test 150 has non-linearities such as, for example, inconsistent metal-to-metal contacts or other non-linear electrical junctions, the first and second excitation signals will mix resulting in the generation of inter-modulation products in the manner discussed above.

A second coaxial cable 152 is connected to an output port on the device under test 150. The first and second excitation signals, any generated inter-modulation products (i.e., the PID signal) and any interfering signals may exit the device under test 150 through the output port and be passed through the coaxial cable 152 to the duplexer 160. The duplexer 160 may separate the signal energy in the transmit band from the signal energy in the receive band. The signal energy in the transmit band (including the fundamental components corresponding to the first and second excitation signals and some of the inter-modulation products) may be delivered to a load 162 for termination. The signal energy in the receive frequency band may be delivered to a receiver 180. The receiver 180 may perform additional filtering (e.g., the duplexer may route all signal energy below a certain frequency toward the receiver 180, and the receiver 180 will filter out all signal energy except for signal energy within a specific receive frequency band of the receiver 180) and may down-convert the signal energy in the receive frequency band to a digitized baseband signal or to an intermediate frequency (IF) signal. The down-converted signal will include the down-converted spread-spectrum PID signal(s) and any interfering signals.

The down-converted signal is provided to a processor 182 that performs a Fourier transform to convert the time domain signal into a frequency domain representation. The output of the processor 182 is provided to the signal analyzer 170. It will be appreciated that the signal analyzer 170 may perform this Fourier transform in some embodiments.

Figure 3:
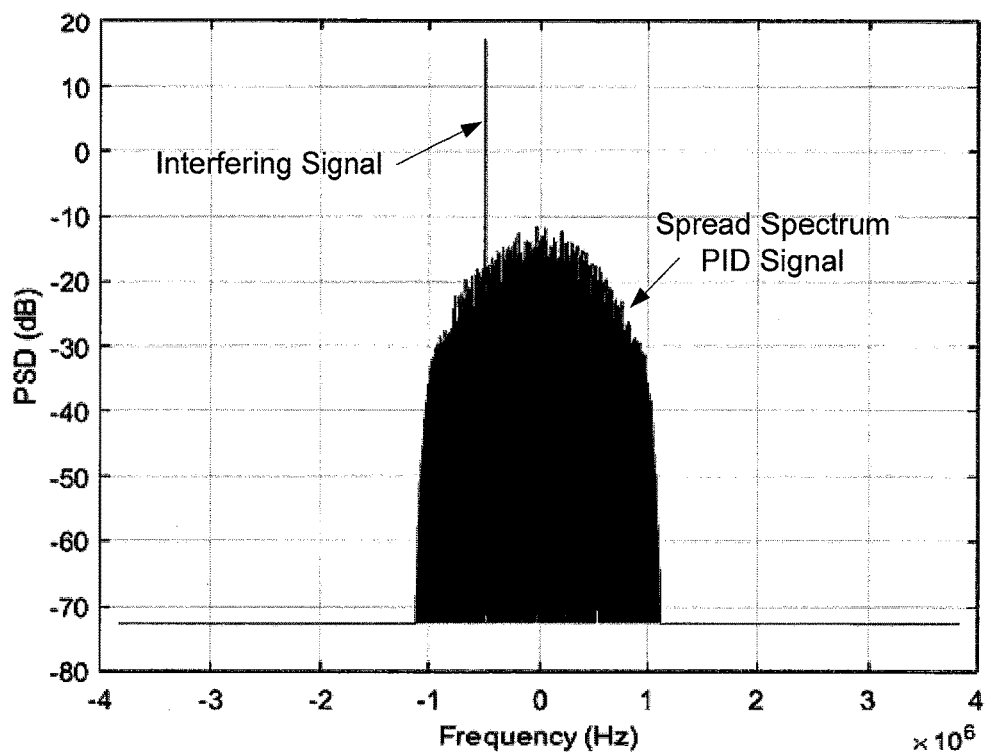
FIG. 3 is a graph illustrating the combined spectrum of a PID signal and an interfering signal prior to de-spreading that may be generated during a PID test performed according to embodiments of the present invention.

FIG. 3 is a graph illustrating the combined spectrum of the spread spectrum PID signal and an interfering signal after down-conversion by the receiver 180 but prior to de-spreading of the received signal. In FIG. 3, the horizontal axis represents frequency (in MHz) and the vertical axis represents the power of the signal (in dB). In FIG. 3 (as well in FIG. 4, which is discussed below), the position along the horizontal axis is normalized so that the PID signal is centered at 0 Hz. As can be seen in FIG. 3, in an example embodiment, the received signal has a bandwidth of about 2 MHz (which bandwidth may correspond to the bandwidth of the second spread spectrum excitation signal). The received signal comprises the down-converted spread spectrum PID signal, which is spread across the 2 MHz bandwidth and an interfering signal that is located at −0.5 MHz (in this example an interfering signal was intentionally added as a continuous wave signal). The magnitude of the interfering signal is significantly greater than the magnitude of the spread spectrum PID signal as the PID signal is spread across the 2 MHz bandwidth.

The same pseudo-random code sequence that was applied to the second continuous wave RF signal to form the second spread spectrum excitation signal may then be applied to the down-converted excitation signal. The receiver 180 may, for example, apply this pseudo-random code sequence to the down-converted received signal. The applied pseudo-random code sequence acts to de-spread the portion of the down-converted received signal that corresponds to the spread spectrum PID signal. Moreover, as discussed above, since the interfering signal is not a spread spectrum signal, application of the pseudo-random code sequence to the received signal acts to convert the interfering signal(s) into spread spectrum signal(s). This is shown graphically in FIG. 4.

Figure 4:
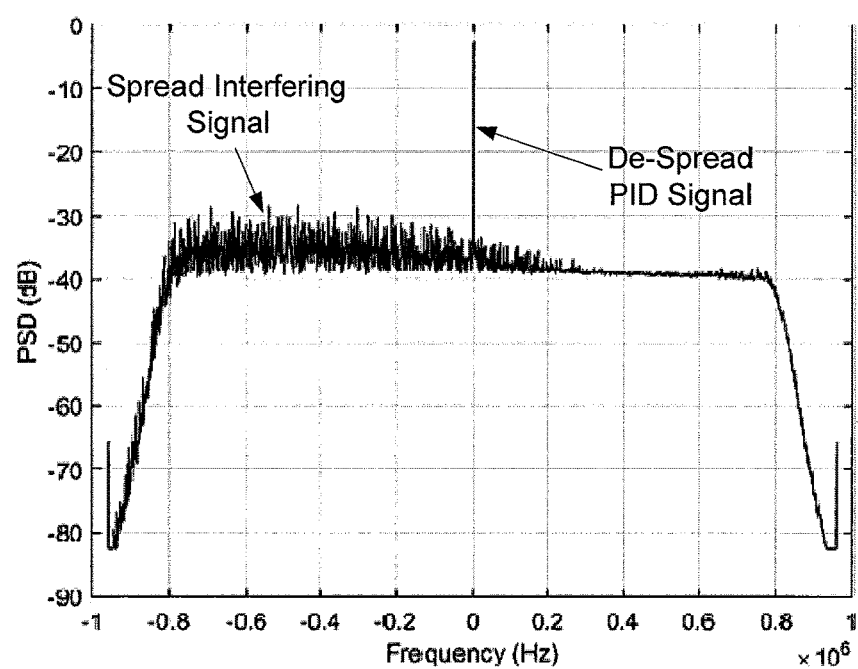
FIG. 4 is a graph illustrating the combined spectrum of the spread spectrum PID signal and the interfering signal in the PID test of FIG. 3 after de-spreading of the received signal at the receiver.

In particular, FIG. 4 is a graph illustrating the combined spectrum of the spread-spectrum PID signal and the interfering signal of FIG. 3 after de-spreading of the received signal at the receiver 180. As shown in FIG. 4, the de-spread PID signal is centered at 0 MHz and, in this example, has a signal level that is about 40 dB above the noise floor. The interfering signal is spread across a 2 MHz bandwidth by application of the pseudo random code sequence, and is centered at about −0.5 MHz. The power level of the interfering signal is reduced significantly by the spreading operation and hence in FIG. 4 the interfering signal has a peak power level that is about 30 dB below the peak power level of the PID signal, in contrast to the situation in FIG. 3 where the peak power level of the interfering signal was about 30 dB above the peak power level of the PID signal. As a result, the PID signal may be easily measured despite the presence of the interfering signal.

In the above example, the interfering signal was a continuous wave RF signal having a very small bandwidth, as is shown graphically in FIG. 3. When the interfering signal is a modulated signal having a larger bandwidth, it may be advantageous to increase the bandwidth of the PID signal. The change in power level that occurs in the interfering signal when the PID testing method according to the above-described embodiments of the present invention is used may be calculated (in dB) by Equation (4) as follows:

$$10[\log(B_2)-\log(B_1+B_2)] \qquad (4)$$

In Equation (4), $B_1$ represents the bandwidth of the spread spectrum PID signal and $B_2$ represents the bandwidth of the interfering signal (before spreading). As can be seen from Equation (4), a larger value of $B_1$ results in the interfering signal being spread over a larger bandwidth, which results in a corresponding reduction in the power spectral density of the interfering signal.

It will be appreciated that a wide variety of modifications may be made to the above-described example embodiments without departing from the teachings of the present invention. For example, the second spread spectrum excitation signal may have any appropriate bandwidth. It will also be appreciated that signals other than continuous wave signals may be used for the first and second excitation signals. Also, it will be appreciated that more than two excitation signals may be used in some embodiments.

It will also be appreciated that the PID test may focus on different ones of the inter-modulation products. For example, first consider a traditional PID test in which two continuous wave excitation signals are used having frequencies of 900 MHz ($f_1$) and 905 MHz ($f_2$) so that there is a 5 MHz separation between the two excitation signals. The third order inter-modulation products generated by these two excitation signals will comprise a first third order inter-modulation product at $2f_1-f_2=895$ MHz and a second third order inter-modulation product at $2f_2-f_1=910$ MHz. Thus, the first third order inter-modulation product is 5 MHz below the lower frequency one of the two excitation signals and the second third order inter-modulation product is 5 MHz above the higher frequency one of the two excitation signals.

Now, if we replace the second excitation signal with a second spread spectrum excitation signal having a bandwidth of 2 MHz, then the first third order inter-modulation product will be located 5 MHz below the lower frequency one of the two excitation signals (i.e., at 895 MHz) and will have a bandwidth of 2 MHz, and the second third order inter-modulation product will be located 5 MHz above the higher frequency one of the two excitation signals (i.e., at 910 MHz) and will have a bandwidth of 4 MHz. It will be appreciated that the PID test may be designed so that either of these third order inter-modulation products will fall within the bandwidth of the receiver. In some cases, it may be advantageous to design the PID test so that the spread spectrum PID signal having the same bandwidth as the second spread spectrum excitation signal falls within the bandwidth of the receiver, but it will be appreciated that embodiments of the present invention are not limited thereto. The frequencies of the first and second excitation signals can also be interchanged so that the spread spectrum PID signal with a bandwidth of 2 MHz will be located at 910 MHz.

In further embodiments, of the present invention, more than one of the excitation signals may be a spread spectrum excitation signal. It will also be appreciated that, in other embodiments, spread spectrum techniques other than pseudo-random code sequence spread spectrum techniques could be used such as frequency hopping spread spectrum techniques.

It will also be appreciated that the above techniques may be used during both passive and active PID tests. In an active PID test, the device under test may be subjected to external forces such as hammer blows, vibrations or the like during the test. Such active PID tests may be more effective at identifying devices under test that are prone to PID degradation.

Figure 5:
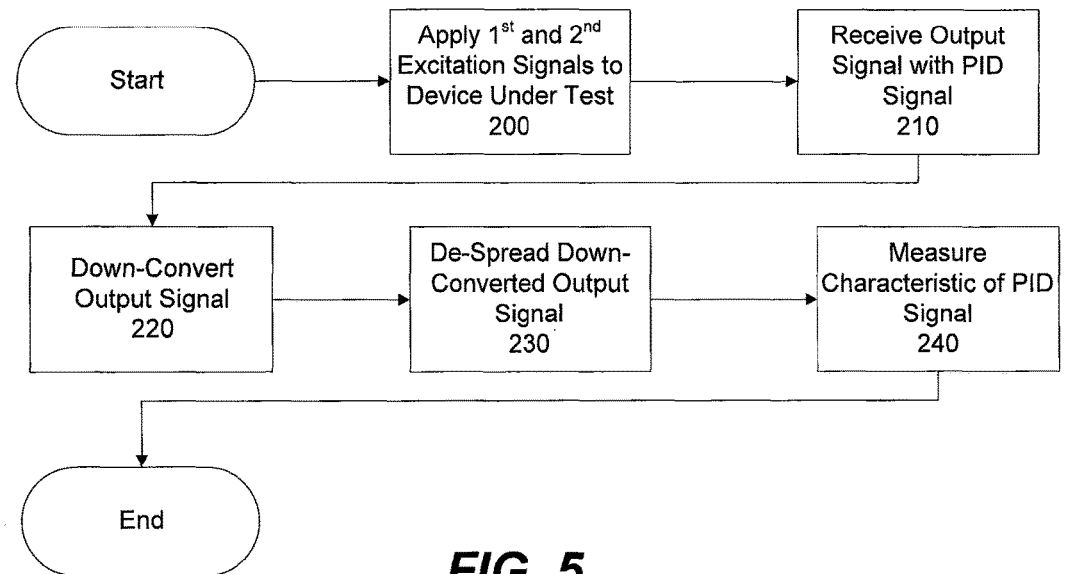
FIG. 5 is a flow chart illustrating a method of performing a PID test according to embodiments of the present invention.

FIG. 5 is a flow chart illustrating a method of performing a PID test according to embodiments of the present invention. As shown in FIG. 5, operations may begin with first and second excitation signals being applied to a device whose PID is to be tested (the "device under test") (block 200). The first excitation signal may be a first continuous wave excitation signal and the second excitation signal may be a second spread spectrum excitation signal. The second spread spectrum excitation signal may be generated, for example, by applying a first pseudo-random code sequence to a second continuous wave excitation signal in some embodiments.

An output signal that includes a PID signal that is generated from mixing of the first and second excitation signals is received (block 210). The output signal may be received, for example, at a receiver. The receiver may be used to down-convert the output signal to a digitized baseband signal or to an intermediate frequency signal (block 220). The output signal may include a spread spectrum PID signal. At least a portion of the output signal may be de-spread (block 230). The portion of the output signal that is de-spread may be the spread spectrum PID signal that is generated by mixing of the first excitation signal and the second spread spectrum excitation signal. The spread spectrum PID signal may be de-spread by applying the first pseudo-random code sequence to the output signal. An interfering signal may be included in the output signal. Applying the first pseudo-random code sequence to the output signal may spread the interfering signal. After the spread spectrum PID signal is de-spread and any interfering signal is spread, a characteristic of the PID signal may be measured (block 240). The characteristic of the PID signal may comprise, for example, a power level of the PID signal.

Figure 6:
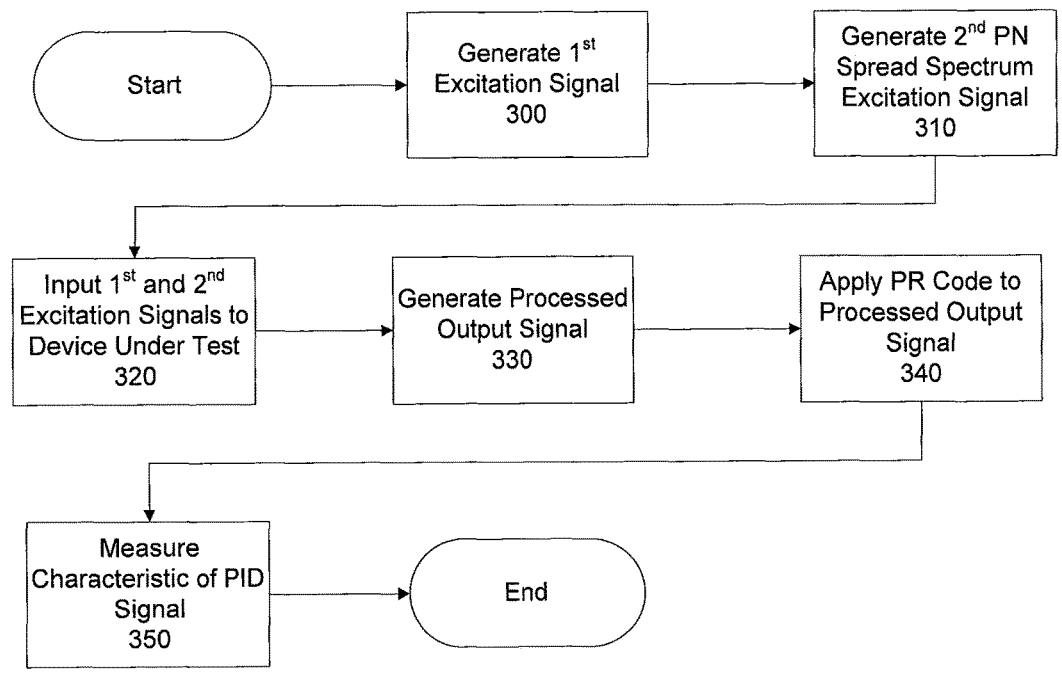
FIG. 6 is a flow chart illustrating a method of performing a PID test according to further embodiments of the present invention.

FIG. 6 is a flow chart illustrating a method of performing a PID test according to further embodiments of the present invention.

As shown in FIG. 6, operations may begin with generation of a first excitation signal (block 300). A first pseudo-random code sequence may be applied to a second signal to generate a second spread spectrum excitation signal (block 310). The first excitation signal and a second spread spectrum excitation signal may then be input to a device under test (block 320). An output signal that is output from the device under test may be processed to generate a processed output signal (block 330). The processing of the output signal may include filtering the output signal based on a bandwidth of a receive frequency band of the device under test, and may further include down-converting the filtered signal to one of baseband or an intermediate frequency. The first pseudo-random code sequence is applied to the processed output signal (block 340). The processed output signal may include a spread spectrum PID signal, and applying the first pseudo-random code sequence to the processed output signal may de-spread the spread spectrum PID signal. Applying the first pseudo-random code sequence to the processed output signal may further convert an interfering signal included in the processed output signal into a spread spectrum interfering signal. Thereafter, a characteristic of a PID signal included in the processed output signal may be measured (block 350). The characteristic of the PID signal may comprise, for example, a power level of the PID signal.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Herein, the terms "attached", "connected", "interconnected", "contacting", "mounted" and the like can mean either direct or indirect attachment or contact between elements, unless stated otherwise.

It will also be appreciated that the various embodiments described above may be combined in any and all ways to provide additional embodiments.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A method of performing a passive inter-modulation distortion ("PID") test, the method comprising:
applying a first excitation signal and a second excitation signal to a device under test, where at least one of the first and second excitation signals is a spread spectrum excitation signal;
receiving an output signal that includes a PID signal generated from mixing of the first and second excitation signals;
de-spreading at least a portion of the output signal; and
measuring a characteristic of the PID signal.

2. The method of claim 1, wherein the output signal includes a spread spectrum PID signal.

3. The method of claim 2, wherein the at least the portion of the output signal that is de-spread comprises the spread spectrum PID signal.

4. The method of claim 1, wherein the first RF excitation signal comprises a continuous wave radio frequency (RF) excitation signal and the spread spectrum excitation signal comprises a continuous wave RF signal that has had a first pseudo-random code sequence applied thereto.

5. The method of claim 4, wherein de-spreading at least the portion of the output signal comprises applying the first pseudo-random code sequence to the output signal.

6. The method of claim 5, further comprising spreading an interfering signal included in the output signal.

7. The method of claim 1, further comprising down-converting the output signal prior to de-spreading at least the portion of the output signal.

8. The method of claim 7, wherein down-converting the output signal comprises down-converting the output signal to a digitized base band signal.

9. The method of claim 7, wherein down-converting the output signal comprises down-converting the output signal to an intermediate frequency signal having a frequency that is less than a frequency of the first excitation signal.

10. The method of claim 4, wherein a chip rate of the pseudo-random code sequence is selected to generate a spread spectrum PID signal having a bandwidth that lies within a receive frequency bandwidth of the device under test.

11. The method of claim 1, wherein the PID signal comprises a third order inter-modulation product of the first excitation signal and the second spread spectrum excitation signal, wherein a center frequency of the PID signal is a frequency that is twice a center frequency of the first excitation signal minus a center frequency of the second spread spectrum excitation signal.

12. The method of claim 11, wherein a frequency of the first excitation signal is less than a center frequency of the second spread spectrum excitation signal.

13. The method of claim 11, wherein a frequency of the first excitation signal is greater than a center frequency of the second spread spectrum excitation signal.

14. A method of performing a passive inter-modulation distortion ("PID") test, the method comprising:
generating a first excitation signal;
applying a first pseudo-random code sequence to a second signal to generate a second spread spectrum excitation signal;
applying the first excitation signal and the second spread spectrum excitation signal to a device under test;
processing an output signal that is output from the device under test to generate a processed output signal;
applying the first pseudo-random code sequence to the processed output signal; and
measuring a characteristic of a PID signal included in the processed output signal.

15. The method of claim 14, wherein the PID signal included in the processed output signal comprises a spread spectrum PID signal, and wherein applying the first pseudo-random code sequence to the processed output signal de-spreads the spread spectrum PID signal.

16. The method of claim 15, wherein applying the first pseudo-random code sequence to the processed output signal further acts to convert an interfering signal included in the processed output signal into a spread spectrum interfering signal.

17. The method of claim 14, wherein processing the output signal that is output from the device under test to generate a processed output signal comprises filtering the output signal based on a bandwidth of a receive frequency band of the device under test.

18. The method of claim 15, wherein processing the output signal that is output from the device under test to generate a processed output signal comprises down-converting the output signal to one of baseband or an intermediate frequency that is between baseband and a frequency of the first excitation signal.

19. The method of claim 14, wherein the first signal comprises a continuous wave excitation signal and the second excitation signal comprises a continuous wave signal.

20. A passive inter-modulation distortion ("PID") test apparatus, comprising:
at least one signal generator that is configured to generate a first excitation signal and a second spread spectrum excitation signal;
a test apparatus that holds a device under test, the device under test configured to receive the first and second excitations signals from the at least one signal generator;
a receiver that is coupled to an output of the device under test so as to receive and down-convert an output signal that includes a PID signal generated by mixing of the first excitation signal and the second spread spectrum excitation signal;
a de-spreader that de-spreads the down-converted output signal; and
a signal analyzer that measures a characteristic of the de-spread down-converted output signal.

* * * * *